(12) United States Patent
Romero

(10) Patent No.: US 7,906,835 B2
(45) Date of Patent: Mar. 15, 2011

(54) OBLONG PERIPHERAL SOLDER BALL PADS ON A PRINTED CIRCUIT BOARD FOR MOUNTING A BALL GRID ARRAY PACKAGE

(75) Inventor: Robert John Romero, Anaheim, CA (US)

(73) Assignee: Broadcom Corporation, Irvine, CA (US)

( * ) Notice: Subject to any disclaimer, the term of this patent is extended or adjusted under 35 U.S.C. 154(b) by 381 days.

(21) Appl. No.: 11/837,835

(22) Filed: Aug. 13, 2007

(65) Prior Publication Data

US 2009/0045508 A1   Feb. 19, 2009

(51) Int. Cl.
*H01L 23/495* (2006.01)

(52) U.S. Cl. ........ 257/666; 257/678; 257/728; 257/778; 257/787; 257/E23.037; 257/E23.043

(58) Field of Classification Search .......................... None
See application file for complete search history.

(56) References Cited

U.S. PATENT DOCUMENTS

| 5,872,051 | A * | 2/1999 | Fallon et al. ................ 438/616 |
| 6,218,630 | B1 | 4/2001 | Takigami |
| 6,268,568 | B1 | 7/2001 | Kim |
| 6,664,615 | B1 * | 12/2003 | Bayan et al. ................ 257/666 |
| 7,259,460 | B1 * | 8/2007 | Bayan et al. ................ 257/728 |
| 7,433,201 | B2 * | 10/2008 | Cherian ....................... 361/767 |
| 2005/0062151 | A1 | 3/2005 | Nagao |

OTHER PUBLICATIONS

European Search Report from application No. 08014165.8, dated Mar. 18, 2010, 3 pages.

* cited by examiner

*Primary Examiner* — Mary Wilczewski
*Assistant Examiner* — Khanh B Duong
(74) *Attorney, Agent, or Firm* — Fiala & Weaver P.L.L.C.

(57) ABSTRACT

Methods, systems, and apparatuses for ball grid array land patterns are provided. A ball grid array land pattern includes a plurality of land pads and electrically conductive traces. The plurality of land pads is arranged in an array of rows and columns. A perimeter edge of the array includes a pair of adjacent oblong shaped land pads. An electrically conductive trace is routed between the pair of adjacent oblong shaped land pads from a land pad positioned in an interior of the array to a location external to the array. The oblong shaped land pads are narrower than standard round land pads, and thus provide more clearance for the routing of traces. The oblong shaped land pads enable more land pads of the land pattern array to be routed external to the array on each routing layer, and thus can save printed circuit board component and assembly costs.

21 Claims, 7 Drawing Sheets

OBLONG PERIPHERAL SOLDER BALL PADS ON A PRINTED CIRCUIT BOARD FOR MOUNTING A BALL GRID ARRAY PACKAGE

BACKGROUND OF THE INVENTION

1. Field of the Invention

The present invention relates to printed circuit boards (PCBs), and more particularly, to land patterns and associated routing in PCBs.

2. Background Art

Integrated circuit (IC) chips or dies from semiconductor wafers are typically interfaced with other circuits using a package that can be attached to a printed circuit board (PCB). One such type of IC die package is a ball grid array (BGA) package. BGA packages provide for smaller footprints than many other package solutions available today. A BGA package has an array of solder ball pads located on a bottom external surface of a package substrate. Solder balls are attached to the solder ball pads. The solder balls are reflowed to attach the package to the PCB. BGA packages are available in a variety of types, including plastic BGA (PBGA) packages, flex BGA packages, fine pitch BGA (FPBGA or FBGA) packages, and wafer-level BGA (WLBGA) packages, for example.

BGA packages are typically mounted to a PCB by attaching the package to a land pattern formed in a top routing layer of the PCB. The land pattern includes a plurality of electrically conductive land pads arranged in an array of rows and columns. Each solder ball on the bottom of the BGA package attaches to a corresponding land pad of the land pattern when the BGA package is mounted to the PCB. PCBs typically include multiple electrically conductive routing layers that have traces formed therein to route signals from the land pads to other locations of the PCB. For example, traces are typically formed in the top routing layer of the PCB to route out the first couple of peripheral rows of the array. Traces that are routed from land pads of the peripheral edges of the array do not need to pass between other land pads. Traces that are routed from land pads that are internal to the array (e.g., not in the peripheral edges) are typically routed between land pads located in the periphery of the array to reach external to the array.

BGA package sizes are shrinking as the demand for smaller and smaller electronic devices increases. As such, the sizes of the BGA package land patterns are also shrinking, making it increasingly more difficult to form routing in PCBs for the land patterns. For example, in some cases, land pads must be moved so close together that traces cannot be routed between them. In such land patterns, only land pads in the peripheral edges of the land pattern can be routed external to the array on the top layer of the PCB. Accordingly, additional routing layers must be added to the PCB to be able to fully route the land pattern. The additional routing layers add to the cost and complexity of PCBs.

Thus, what are needed are improved circuit boards and routing techniques that can accommodate increasingly smaller BGA packages.

BRIEF SUMMARY OF THE INVENTION

Methods, systems, and apparatuses for circuit boards and land patterns for ball grid array packages are provided. Oblong shaped land pads are positioned in a land pattern for a ball grid array package to enable additional land pads of the land pattern to be routed external to the land pattern.

In one example, a ball grid array land pattern on a top routing layer of a circuit board includes a plurality of land pads. The plurality of land pads is arranged in an array of rows and columns. A perimeter edge of the array includes a pair of adjacent oblong shaped land pads. An electrically conductive trace is routed between the pair of adjacent oblong shaped land pads from a land pad positioned in an interior of the array to a location external to the array. The oblong shaped land pads are narrower than standard land pads, and thus provide more clearance for the routing of traces. The oblong shaped land pads enable additional land pads of the land pattern array to be routed external to the array on the top routing layer, and thus can reduce circuit board fabrication and assembly costs.

The pair of adjacent oblong shaped land pads includes a first oblong shaped land pad and a second oblong shaped land pad. The first and second oblong shaped land pads each have a length along a first axis that is perpendicular to the perimeter edge and a width along a second axis that is perpendicular to the first axis. The length of the oblong shaped land pads is greater than their width.

In a further example, the width, W, of the oblong shaped land pads is configured such that $$W < PP - (TW + 2 \times TS),$$

where
PP=a land pad-to-land pad pitch of the land pattern array.
TW=a width of an electrically conductive trace, and
TS=a manufacturing tolerance for spacing of the trace from other features.

In contrast, conventional round land pads of the land pattern have a diameter, DRP, such that $DRP > PP - (TW + 2 \times TS)$.

The oblong shaped land pads can have various shapes, including having rounded ends, squared ends, and further shaped ends. Any number of oblong shaped land pads may be present in one or more perimeter edges of a land pattern.

These and other objects, advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
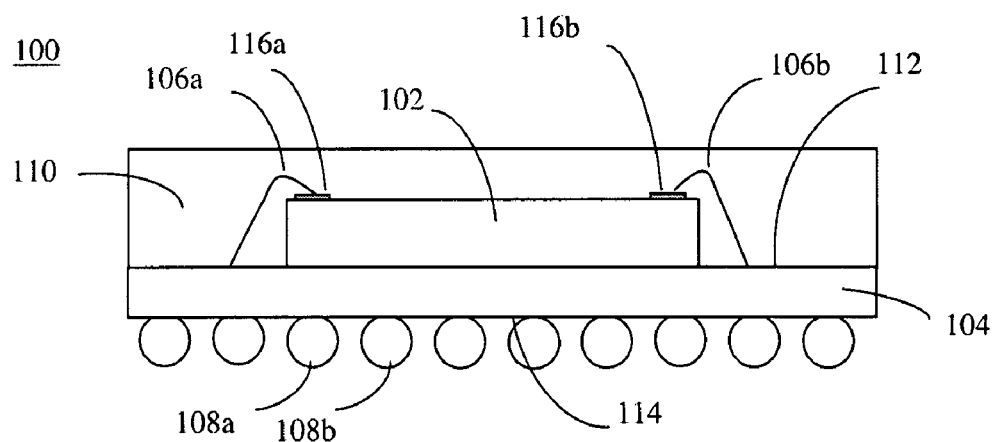
FIG. 1 shows a cross-sectional view of an example BGA package.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

The present specification discloses one or more embodiments that incorporate the features of the invention. The disclosed embodiment(s) merely exemplify the invention. The scope of the invention is not limited to the disclosed embodiment(s). The invention is defined by the claims appended hereto.

The example embodiments described herein are provided for illustrative purposes, and are not limiting. The examples described herein may be adapted to various types of integrated circuit packages. Furthermore, additional structural and operational embodiments, including modifications/alterations, will become apparent to persons skilled in the relevant art(s) from the teachings herein.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

According to embodiments of the present invention provide, routing related to a land pattern is improved through the use of oblong shaped land pads. The oblong shaped land pads are narrower than standard round land pads, and thus provide more clearance for the routing of traces. The oblong shaped land pads enable more land pads of the land pattern array to be routed external to the array on the top routing layer relative to conventional techniques, and thus can save printed circuit board fabrication and assembly costs. Such improved land patterns are used to mount integrated circuit packages, such as BGA packages. Example BGA packages applicable to embodiments of the present invention are described as follows. Conventional PCB land patterns and routing techniques are then described, followed by a description of some example embodiments of the present invention, which overcome limitations of conventional land patterns and associated routing.

Example Ball Grid Array Packages and Associated Land Patterns

FIG. 1 shows a cross-sectional view of an example BGA package 100. BGA package 100 includes an integrated circuit die/chip 102, a substrate 104, bond wires 106, a plurality of solder balls 108, and an encapsulating material 110. Substrate 104 has a first (e.g., top) surface 112 that is opposed to a second (e.g., bottom) surface 114 of substrate 104. As shown in FIG. 1, chip 102 is mounted to first surface 112 of substrate 104. Chip 102 may be mounted to substrate 104 using an adhesive material (e.g., a chip attach material, not shown in FIG. 1), as would be known to persons skilled in the relevant art(s).

As shown in FIG. 1, a plurality of bond wires 106 are coupled between terminals 116 of chip 102 and electrically conductive features, such as traces, bond fingers, etc. (not shown in FIG. 1), at first surface 112 of substrate 104. For example, a first bond wire 106*a* is connected between a terminal 116*a* and first surface 112 of substrate 104, and a second bond wire 106*b* is connected between terminal 116*b* and first surface 112 of substrate 104. Any number of bond wires 106 may be present, depending on a number of signals (at terminals 116) of chip 102 to be coupled to conductive features of first surface 112 of substrate 104. Bond wires 106 may be wires formed of any suitable electrically conductive material, including a metal such as gold, silver, copper, aluminum, other metal, or combination of metals/alloy. Bond wires 106 may be attached according to wire bonding techniques and mechanisms well known to persons skilled in the relevant art(s).

As further shown in FIG. 1, encapsulating material 110 covers chip 102 and bond wires 106 on first surface 112 of substrate 104. Encapsulating material 110 protects chip 102 and bond wires 106 from environmental hazards. Encapsulating material 110 may be any suitable type of encapsulating material, including an epoxy, a molding compound, etc. Encapsulating material 110 may be applied in a variety of ways, including by a saw singulation technique, injection into a mold, etc.

Figure 2:
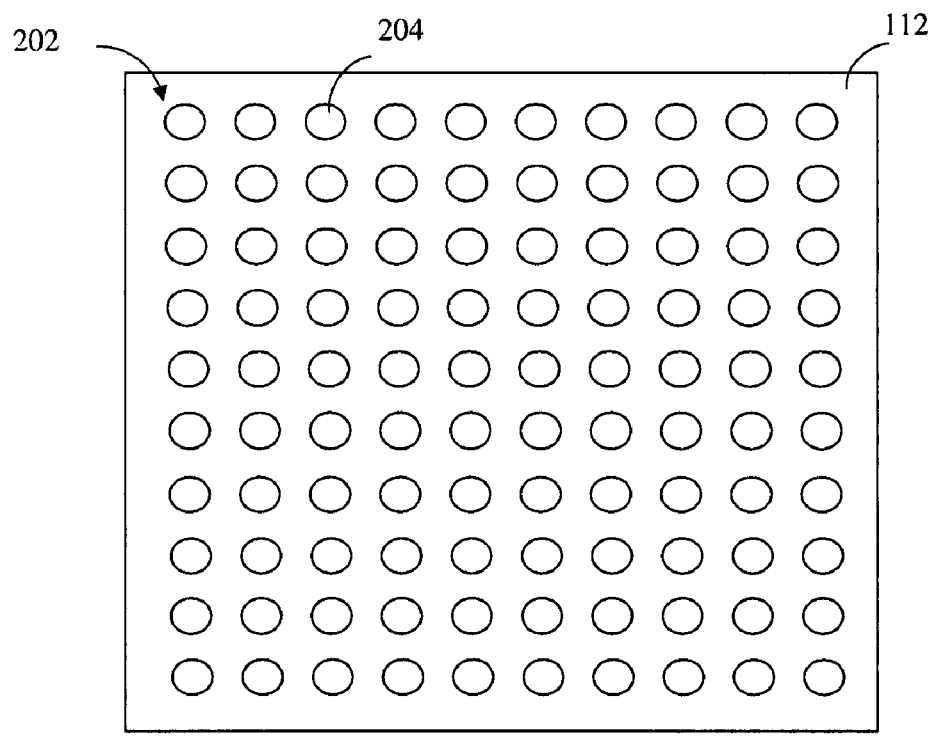
FIG. 2 shows a bottom view of the BGA package of FIG. 1.

A plurality of solder balls 108 (including solder balls 108*a* and 108*b*) is attached to second surface 114 of substrate 104. FIG. 2 shows a plan view of second surface 114 of substrate 104 (solder balls 108 are not shown in FIG. 2). As shown in FIG. 2, second surface 114 of substrate 104 includes an array 202 of solder balls pads 204. In the example of FIG. 2, array 202 includes 100 solder ball pads 204 arranged in a 10 by 10 array. In other implementations, array 202 may include fewer or greater numbers of solder ball pads 204 arranged in any number of rows and columns. Solder ball pads 204 are attachment locations for solder balls 108 (shown in FIG. 1) on package 100. Solder ball pads 204 are electrically coupled through substrate 104 (e.g., by electrically conductive vias and/or routing) to the electrically conductive features (e.g., traces, bond fingers, contact regions, etc.) of first surface 112 of substrate 104 to enable signals of chip 102 to be electrically connected to solder balls 108.

Substrate 104 may include one or more electrically conductive layers (such as at first surface 112) that are separated by one or more electrically insulating layers. For example, BGA substrates having two electrically conductive layers or four electrically conductive layers are common. The electrically conductive layers may be made from an electrically conductive material, such as a metal or combination of metals/alloy, including copper, aluminum, tin, nickel, gold, silver, etc. In embodiments, substrate 104 may be rigid or may be flexible (e.g., a "flex" substrate). The electrically insulating later(s) may be made from ceramic, plastic, tape, and/or other suitable materials. For example, the electrically insulating layer(s) of substrate 104 may be made from an organic material such as BT (bismaleimide triazine) laminate/resin, a flexible tape material such as polyimide, a flame retardant fiberglass composite substrate board material (e.g., FR-4), etc.

Other configurations for BGA package 100 are within the scope of embodiments of the present invention. For example, package 100 in FIG. 1 is a die-up type BGA package. Alternatively, package 100 may be configured as a die-down BGA package, where chip 102 is mounted to second surface 114 of substrate 104. Furthermore, package 100 may include heat spreaders and/or heat sinks configured to spread heat within and/or outside package 100. For example, in an embodiment, chip 102 may be mounted to a heat spreader/stiffener in package 100.

Solder balls 108 enable BGA package 100 to be mounted to another substrate, such as a circuit board (e.g., a printed circuit board), etc. Package 100 typically mounts to a land pattern on a surface of the circuit board that matches (i.e., is a mirror image of) the pattern of solder balls 108 on second surface 114 of substrate 104. Package 100 is applied to the circuit board, and solder balls 108 are reflowed to cause them to attach to contact pads of the land pattern.

Figure 3:
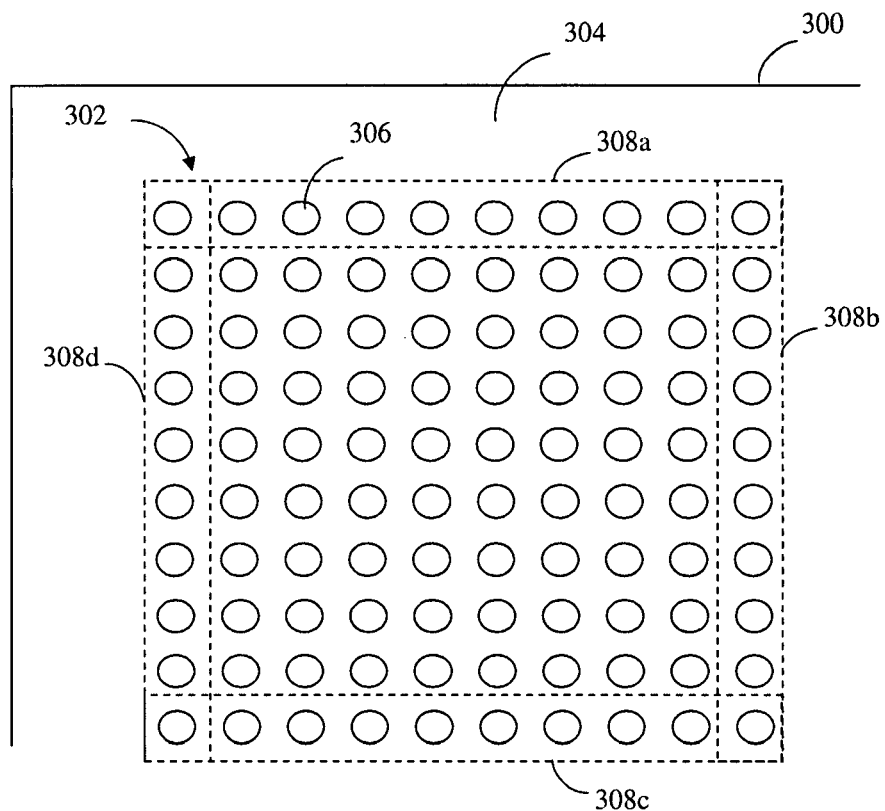
FIG. 3 shows a plan view of an example land pattern on a PCB.

FIG. 3 shows an example land pattern 302 on a surface 304 of a printed circuit board (PCB) 300 (a corner portion of PCB 300 is shown in FIG. 3, for ease of illustration). As shown in FIG. 3, land pattern 302 includes a plurality of land pads 306 arranged in a 10 by 10 array of rows and columns. Land pattern 302 is suitable for mounting package 100, which includes a 10 by 10 array of solder balls 108. Land pads 306 are substantially round in shape, and are made of an electrically conductive material. For example, land pads 306 may be formed of a metal or combination of metals/alloy, such as copper, aluminum, tin, nickel, gold, silver, etc. Furthermore, land pads 306 may be coated/plated with an electrically conductive material, such as a solder material, to enable/enhance a reflow or other process for attaching package 100 to land pattern 302.

FIG. 3 shows land pattern 302 with land pads 306, but does not show routing on surface 304 related to land pads 306. In the example of FIG. 3, traces (not shown in FIG. 3) may be routed from edge land pads 306 on surface 304 to locations of surface 304 external to land pattern 302. As shown in FIG. 3, land pattern 302 includes four edge regions referred to as edges 308a-308d. Edges 308a-308d each include ten land pads 306 located along a respective perimeter edge of land pattern 302. A trace may be routed from each land pad 306 of edges 308a-308d to a location external to land pattern 302. However, due to the close proximity of land pads 306 in land pattern 302, traces cannot be routed from land pads 306 internal to land pattern 302 (within a boundary formed by edges 308a-308d) to external locations. Not enough space is available between adjacent land pads 306 in land pattern 302 to route traces between them.

Figure 4:
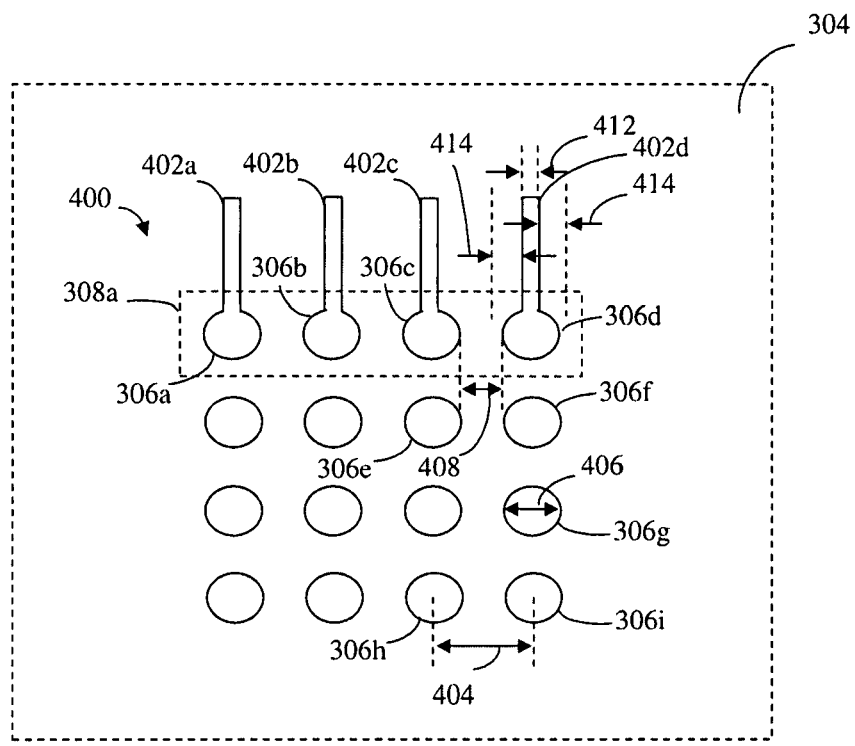
FIG. 4 shows a portion of the land pattern of FIG. 3, with example routing.

The inability to route traces between land pads 306 of land pattern 302 is further described with respect to FIG. 4. FIG. 4 shows a portion 400 of land pattern 302 of FIG. 3, with example routing. Portion 400 is a middle portion of edge 308a of land pattern 302. Portion 400 includes a plurality of land pads 306, such as land pads 306a-306i. The portion of edge 308a shown in FIG. 4 includes land pads 306a-306d. A corresponding one of traces 402a-402b is routed on surface 304 from each of land pads 306a-306d to a location (not shown in FIG. 4) external to land pattern 302.

A solder ball pitch (i.e., center-to-center distance between adjacent solder balls) for BGA packages, such as package 100 shown in FIG. 1, has been decreasing as the demand for smaller package sizes increases. As a result, the land pad pitch (i.e., center-to-center distance between adjacent land pads) of land patterns on PCBs corresponding to the BGA packages has been correspondingly decreasing. FIG. 4 shows a land pad pitch 404 between solder balls 306h and 306i, which is representative of the pitch between all adjacent land pads 306 in land pattern 302. In the example of FIG. 4, pitch 404 is a relatively short distance such that a trace 402 cannot be routed between adjacent land pads 306. As shown in FIG. 4, land pads 306 (e.g., land pads 306e and 306f) are separated by a distance 408. Traces 402 (e.g., trace 402d) have a width 412. Furthermore, traces 402 must be spaced from other electrically conductive features of land pattern 302 (from which they are intended to be electrically isolated) by a manufacturing tolerance spacing 414. In the example of FIG. 4, a relationship between distance 408, trace width 412, and tolerance spacing 414 can be illustrated as follows:

$$D408 < TW412 + 2 \times TS414,  \quad \text{Equation 1}$$

where
D 408=land pad separation distance 408,
TW 412=width 412 of traces 402, and
TS 414=manufacturing tolerance spacing 414 of traces 402.

Equation 1 indicates that distance 408 between adjacent land pads 306 is too small to accommodate a width 412 of a trace 402 and a manufacturing spacing 414 on both sides of the trace 402.

As shown in FIG. 4, land pads 306 (e.g., land pad 306g), which are substantially round, have a diameter 406. Referring to land pads 306h and 306i in FIG. 4, a relationship between pitch 404, distance 408, and diameter 406 can be indicated as follows:

$$PP404 = D408 + \tfrac{1}{2}DRP406 + \tfrac{1}{2}DRP406,$$

$$PP404 = D408 + DRP406,$$

$$D408 = PP404 - DRP406. \quad \text{Equation 2}$$

where
D 408=land pad separation distance 408,
DRP 406=diameter 406 of (round) land pads 306, and
PP 404=land pad pitch 404.

Equation 2 can be substituted into Equation 1, as follows:

$$PP404 - DRP406 < TW412 + 2 \times TS414,$$

$$DRP406 > PP404 - (TW412 + 2 \times TS414). \quad \text{Equation 3}$$

Equation 3 indicates that if diameter 406 of land pads 306 is larger than land pad pitch 404 minus the sum of trace width 412 and two trace tolerance spacings 414, a trace cannot be routed between land pads 306.

For instance, in an example implementation, diameter 406 may be 0.01 inches, land pad pitch 404 may be 0.4 mm (0.0157 inches), trace width 412 may be 0.003 inches, and trace tolerance spacing 414 may be 0.003 inches. These values may be applied to Equation 3 as follows (in inches):

$$DRP406 > PP404 - (TW412 + 2 \times TS414),$$

$$0.01 > 0.0157 - (0.003 + 2 \times (0.003))$$

$$0.01 > 0.0067$$

According to these values, traces 402 cannot be routed between land pads 306. Thus, only the perimeter of land pattern 302 may be routed external to land pattern 302 on surface 304. In FIG. 3, only land pads 306 in edges 308a-308d can be routed on surface 304. Land pads 306 internal to edges 308a-308d must be routed on further routing layers of PCB 300. Because land pattern 302 is a 10 by 10 array of land pads 306, a minimum of 5 routing layers for PCB 300 is necessary to route all land pads 306 of land pattern 302 external to land pattern 302, assuming the routing layer of land pattern 302 is used to route the peripheral edge of land pattern 302, and each subsequent routing layer is used to route a next outermost ring of land pads 306 of land pattern 302.

Example Embodiments

In embodiments of the present invention, oblong shaped land pads are positioned in a land pattern to enable land pads internal to the land pattern to be routed external to the land pattern using fewer routing layers. The oblong shaped land pads are narrower in width, and thus create additional circuit board space for traces and associated trace clearance requirements. The oblong shaped land pads enable attachment of standard solder balls of a BGA package when the BGA package is mounted to the land pattern. Each oblong shaped land pad provides an electrical connection for a signal from the BGA packages to the circuit board. By enabling attachment of solder balls of a BGA package, the oblong shaped land pads provide mechanical support for attachment of the BGA package to the circuit board.

Figure 5:
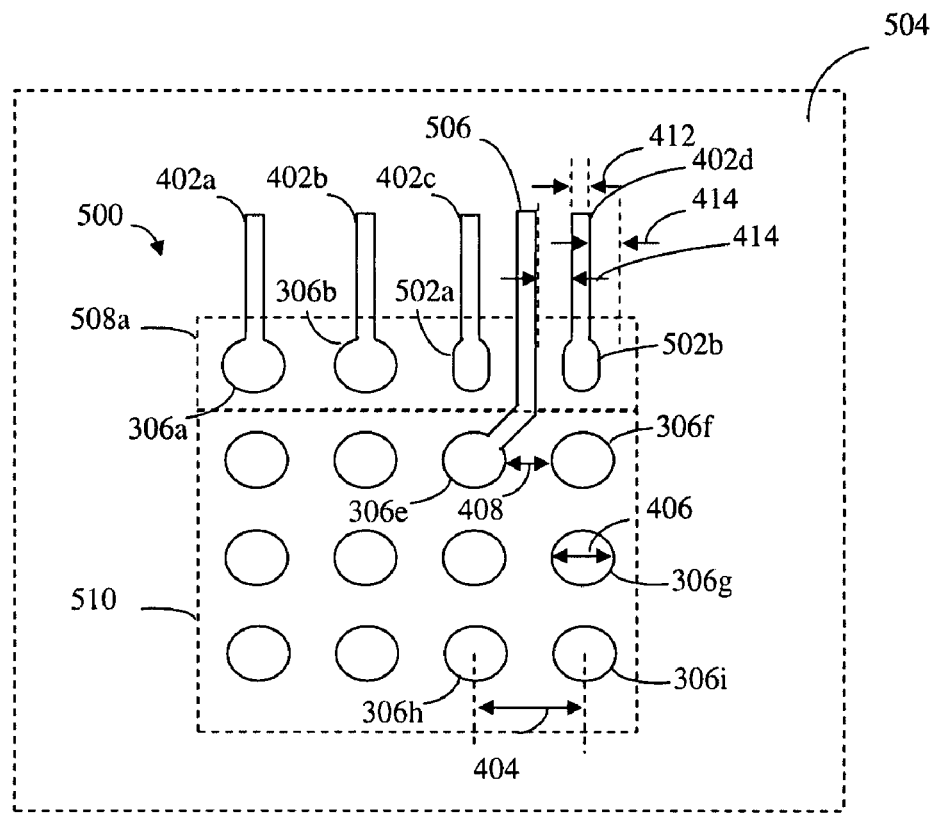
FIG. 5 shows a portion of a land pattern having a pair of oblong shaped land pads, and further shows example routing, according to an example embodiment of the present invention.

FIG. 5 shows a portion 500 of a land pattern, according to an example embodiment of the present invention. Portion 500 includes a four by four land pattern array portion. Portion 500 is located on a surface 504 of a circuit board, such as a printed circuit board. Portion 500 includes a plurality of substantially round land pads 306, such as land pads 306a, 306b, and 306e-306i. Portion 500 further includes a pair of adjacent oblong shaped land pads—a first oblong shaped land pad 502a and a second oblong shaped land pad 502b. An edge 508a of portion 500 includes land pads 306a and 306b and the pair of adjacent oblong shaped land pads 502a and 502b. Land pads shown in FIG. 5 that are not in edge 508a, including substantially round land pads 306e-306i, are in an interior region 510 of the land pattern.

A corresponding one of electrically conductive traces 402a-402d is routed on surface 504 from each of the land pads of edge 508a, including substantially round land pads 306a and 306b and oblong shaped land pads 502a and 502b, to a location external to the land pattern. For the reasons described above, traces cannot be routed between adjacent round land pads 306 (e.g., between land pads 306a and 306b) in FIG. 5. However, an electrically conductive trace 506 is routed between adjacent oblong shaped land pads 502a and 502b. Trace 506 is routed from land pad 306e positioned in an interior of the array to a location (not shown in FIG. 5) external to the array. Thus, the presence of oblong shaped land pads 502 enables routing for one or more land pads in interior region 510 of a land pattern.

Figure 6:
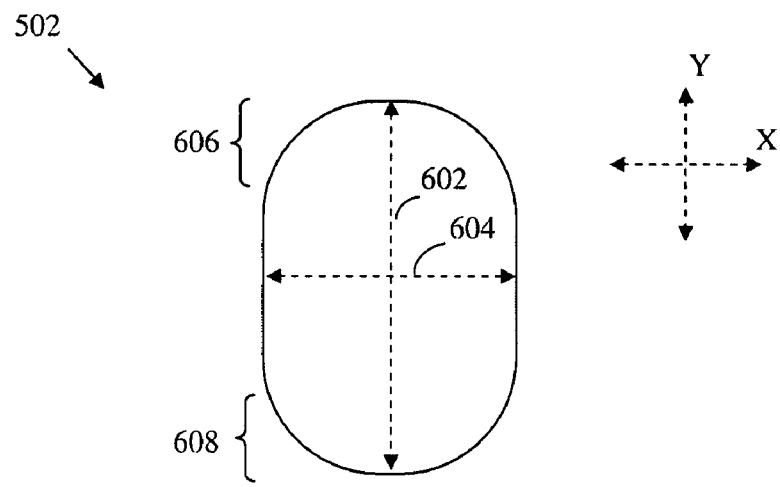
FIG. 6 shows an example oblong shaped land pad, according to an embodiment of the present invention.

FIG. 6 shows a view of an oblong shaped land pad 502, according to an example embodiment of the present invention. Referring to FIGS. 5 and 6, oblong shaped land pad 502 has a length 602 along a first axis (shown as Y-axis in FIG. 6) that is perpendicular to the perimeter edge (e.g., edge 508a) of the land pattern that includes pad 502, and a width 604 along a second axis (shown as X-axis in FIG. 6) that is perpendicular to the first axis. Length 602 is greater than width 604. In embodiments, length 602 may be selected to be the same as diameter 406 of round land pads 306 of portion 500, or may be larger or smaller in length. Width 604 of oblong shaped land pad 502 is selected such that:

$$W604 < PP404 - (TW412 + 2 \times TS414), \quad \text{Equation 4}$$

where

W 604=width 604 of oblong shaped land pad 502.

Equation 4 indicates that when width 604 of oblong shaped land pads 502 is less than pitch 404 minus the sum of trace width 412 and two trace tolerance spacings 414, trace 506 can be routed between a pair of oblong shaped land pads 502.

For instance, width 604 may be selected to be 0.006 inches and length 602 may be 0.01 inches in an example implementation. Applying this width value and the example dimensions illustrated above (land pad pitch 404 of 0.0157 inches, trace width 412 of 0.003 inches, and trace tolerance spacing 414 of 0.003 inches) to Equation 4:

$$W604 < PP404 - (TW412 + 2 \times TS414),$$

$$0.06 < 0.0157 - (0.003 + 2 \times (0.003))$$

$$0.006 < 0.0067$$

Thus, using an oblong shaped land pad width 604 of 0.06 inches with these other example dimensions, trace 506 can be routed between oblong shaped land pads 502. For example, as shown in FIG. 5, land pad 306e in the second outermost row of portion 500 can be routed between oblong shaped land pads 502a and 502b external to portion 500. By replacing further round land pads 306 with oblong shaped land pads 502 in edge 508a, further land pads 306 in the second outermost row of portion 500 can be routed external to land pattern portion 500. In the example of land pattern 302 of FIG. 3, which is a 10 by 10 array of land pads, the required number of routing layers necessary to route all land pads of land pattern 302 external to land pattern 302 may be reduced to four routing layers (from five) by incorporating oblong shaped land pads 502 in edges 308a-308d.

As shown in FIG. 6, oblong shaped land pad 502 has opposing first and second ends 606 and 608 at ends of length 602. In the example of FIG. 6, first and second ends 606 and 608 are rounded. For example, first and second ends 606 and 608 may be hemispherical, curved, or otherwise rounded to any degree. In another embodiment, first and second ends 606 and 608 may be squared, such that oblong shaped land pad 502 is rectangular. In further embodiments, oblong shaped land pad 502 may have another shape such as oval, elliptical, an elongated hexagon, an elongated octagon, other elongated polygon, etc. Oblong shaped land pads 502 are made of an electrically conductive material. For example, oblong shaped land pads 502 may be formed of a metal or combination of metals/alloy, such as copper, aluminum, tin, nickel, gold, silver, etc. Furthermore, oblong shaped land pads 502 may be coated/plated with an electrically conductive material, such as a solder material, to enable/enhance a reflow or other process for attaching package 100.

Figure 7:
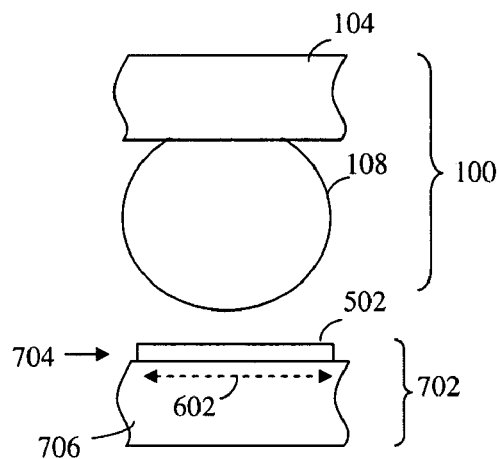
FIGS. 7-9 illustrate attachment of a solder ball to an oblong shaped land pad, according to an example embodiment of the present invention.
Figure 8:
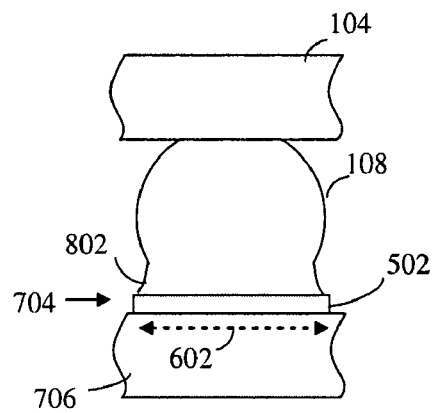
Figure 9:
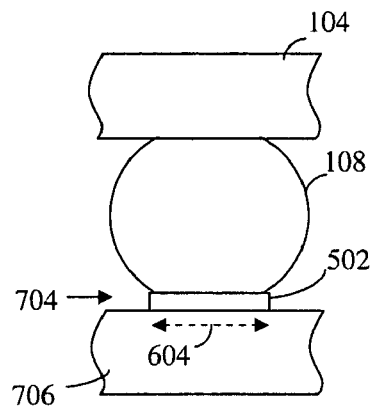

FIGS. 7-9 show cross-sectional views illustrating the mounting of BGA package 100 to a PCB 702 having oblong shaped land pads 502, according to an example embodiment of the present invention. Portions of package 100 and PCB 702 are shown in FIGS. 7-9, for ease of illustration. As shown in FIG. 7, PCB 702 includes an electrically conductive layer 702 that includes oblong shaped land pad 502, and further includes a dielectric layer 706. Additional layers of PCB 702, which may be present in embodiments, are not shown in FIGS. 7-9 for ease of illustration.

In particular, FIGS. 7-9 show a solder ball 108 of package 100 being attached to an oblong shaped land pad 502 of PCB 702. In FIG. 7, package 100 is being positioned adjacent to PCB 702. FIG. 7 shows a view of length 602 of land pad 502. Length 602 and width 604 of land pad 502 may have any suitable values, depending on the particular application, and where length 602 is greater than width 604. For example, oblong shaped land pad 502 may have length 602 of 0.01 inches and a width 604 of 0.006 inches, and solder ball 108 may have a diameter of 0.01 inches.

In FIG. 8, solder ball 108 of package 702 is shown in contact with oblong shaped land pad 502. Solder ball 108 has at least partially melted due to a mounting (e.g., reflow) process for package 100. Due to a melting of solder ball 108, solder ball 108 wicks/spreads into a reflow region 802 located across length 602 of land pad 502, so that length 602 of oblong shaped land pad 502 is covered with solder of solder ball 108. Such coverage of oblong shaped land pad 502 with solder in reflow region 802 enhances a mechanical and electrical coupling of solder ball 108 to oblong shaped land pad 502.

FIG. 9 shows a view of width 604 of land pad 502, with solder ball 108 in contact with oblong shaped land pad 502 as in FIG. 8. In FIG. 9, solder ball 108 has partially melted to attach to oblong shaped land pad 502. However, due to width 604 of oblong shaped land pad 502 being narrow compared to the diameter of solder ball 108, reflow region 802 is not present in FIG. 9, or is less present in FIG. 9 relative to FIG. 8. Because conventional land pads (e.g., land pads 306) are round to accommodate round solder balls, and oblong shaped land pads 502 are not round, the oblong shape of oblong shaped land pads 502 is counter to conventional BGA package mounting technology. When an area of oblong shaped land pads 502 is less than an areas of round land pads 306, oblong shaped land pads 502 may provide less mechanical coupling between package 100 and PCB 702 relative to round land pads 306. However, because oblong shaped land pads 502 are a proportionally small number of the total number of land pads of a land pattern, a loss of mechanical attachment strength of a package to a PCB due to their oblong shape is not significant. Furthermore, oblong shaped land pads 502 enable a PCB to have fewer routing layers, and therefore fewer dielectric layers, and thus can significantly reduce a PCB parts cost and reduce PCB assembly complexity.

Figure 10:
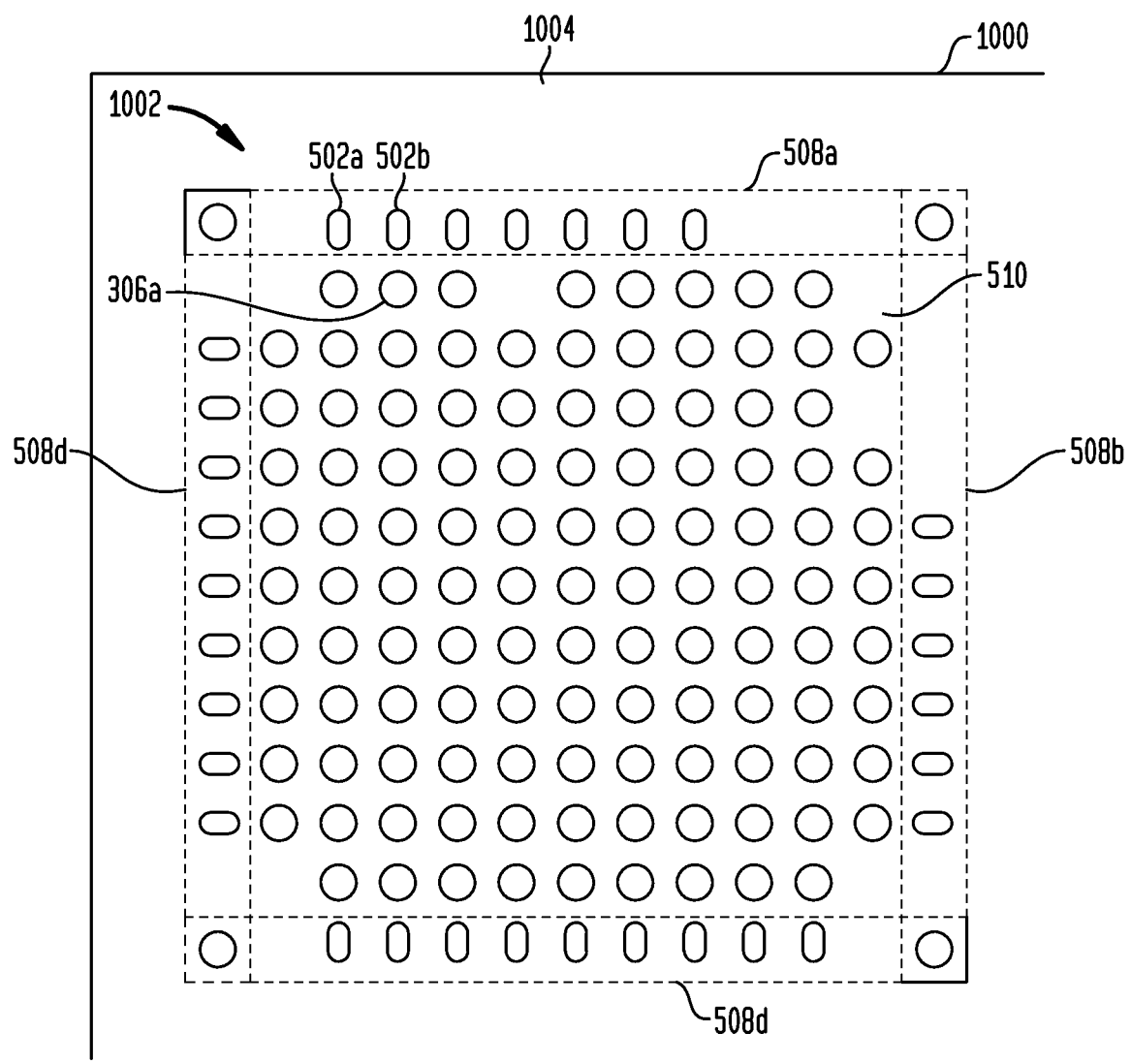
FIG. 10 shows an example land pattern that has perimeter oblong shaped land pads, according to an embodiment of the present invention.

In embodiments, oblong shaped land pads 502 in any number may be formed in edges 508 of land patterns of any size. For instance, FIG. 10 shows a land pattern 1002 (routing not shown in FIG. 10) formed on a surface 1004 of a PCB 1000, according to another embodiment of the present invention. As shown in FIG. 10, land pattern 1002 includes a 13 by 13 array of round land pads 306 and oblong shaped land pads 502 (some array locations have a space instead of a land pad in the example of FIG. 10; thus the array of FIG. 10 is not a completely filled array). In the example of FIG. 10, the four edges 508a-508d of land pattern 1002 each include a plurality of oblong shaped land pads 502, with a round land pad located in each corner of land pattern 1002. In alternative embodiments, some of the land pads of edges 508a-508d that are not located in corners may be round land pads. Land pads in interior 510 of the array of land pattern 1002 are shown as round land pads 306, although other shaped land pads may additionally/alternatively be present in interior 510.

If land pattern 1002 did not include oblong shaped land pads 502, PCB 1000 would require 7 routing layers in order to route all land pads external to the array of land pattern 1002. With oblong shaped land pads 502 as shown in FIG. 10, land pattern 1002 can be fully routed using 6 routing layers, because two peripheral edge rings of land pads can be fully routed on the top routing layer containing land pattern 1002.

Figure 11:
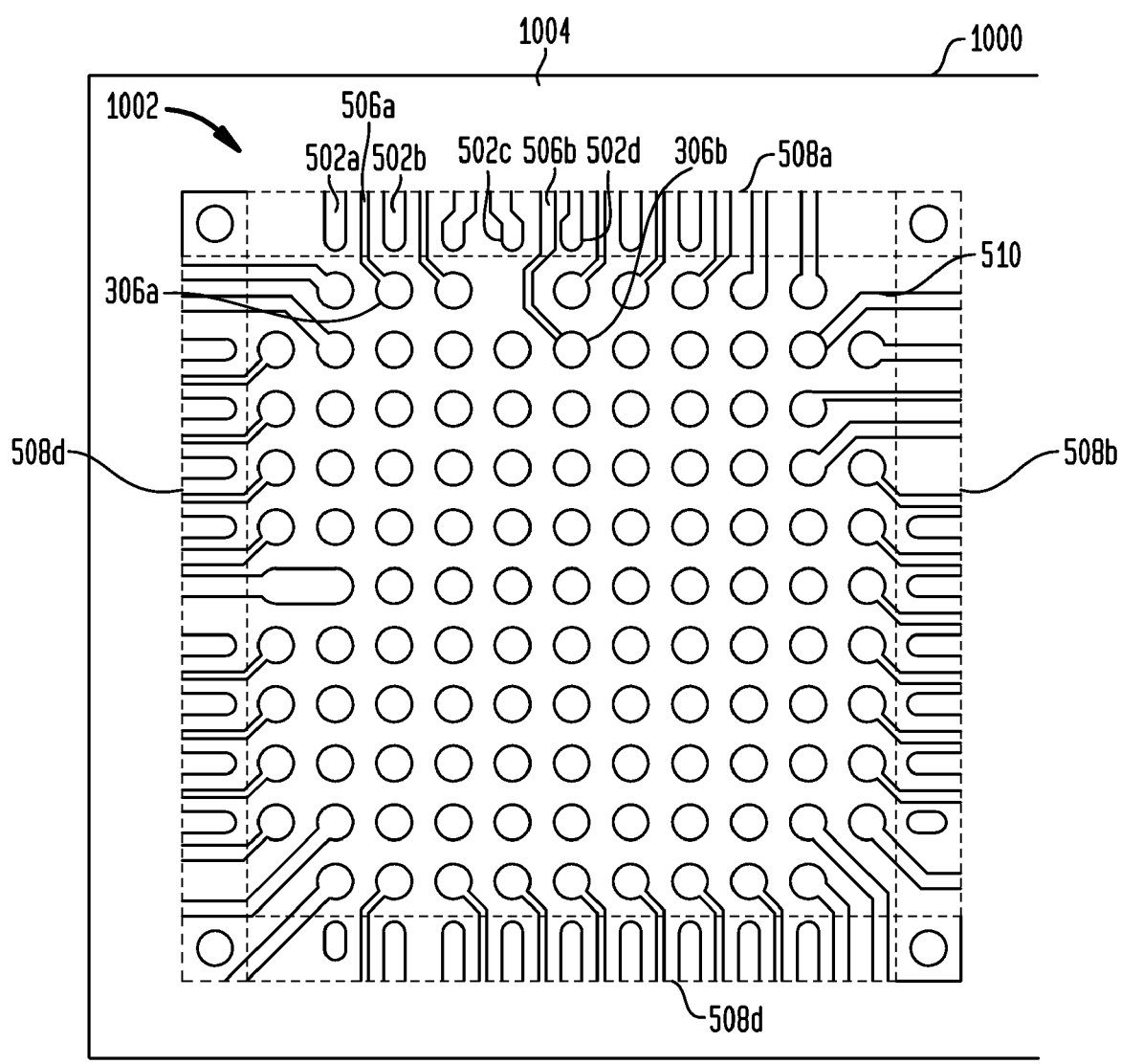
FIG. 11 shows the land pattern of FIG. 10 with example routing, according to an embodiment of the present invention.

FIG. 11 shows land pattern 1002 of FIG. 10 with example routing, according to an embodiment of the present invention. As shown in FIG. 11, each adjacent pair of oblong shaped land pads 502 enables a respective trace to be routed between them external to land pattern 1002. For example, adjacent oblong shaped land pads 502a and 502b have a trace 506a routed between them from a round land pad 306a internal to land pattern 1002 to a location (not shown in FIG. 11) external to land pattern 1002. In FIG. 11, all land pads 306 of interior 510 that are adjacent to edges 508a-508d are coupled to a corresponding trace 506 that routes a signal of the land pad external to land pattern 1002. Furthermore, some land pads 306 even further internal to land pattern 1002 are enabled to be routed external to land pattern 1002 by oblong shaped land pads 502. For example, adjacent oblong shaped land pads 502c and 502d have a trace 506b routed between them from a round land pad 306b, which is three rows deep in land pattern 1002, to a location external to land pattern 1002. Trace 506b is routed from land pad 306b in the third row of land pattern 1002, through a space (where a land pad is not present) in the second row of land pattern 1002, and between oblong shaped land pads 502c and 502d.

Figure 12:
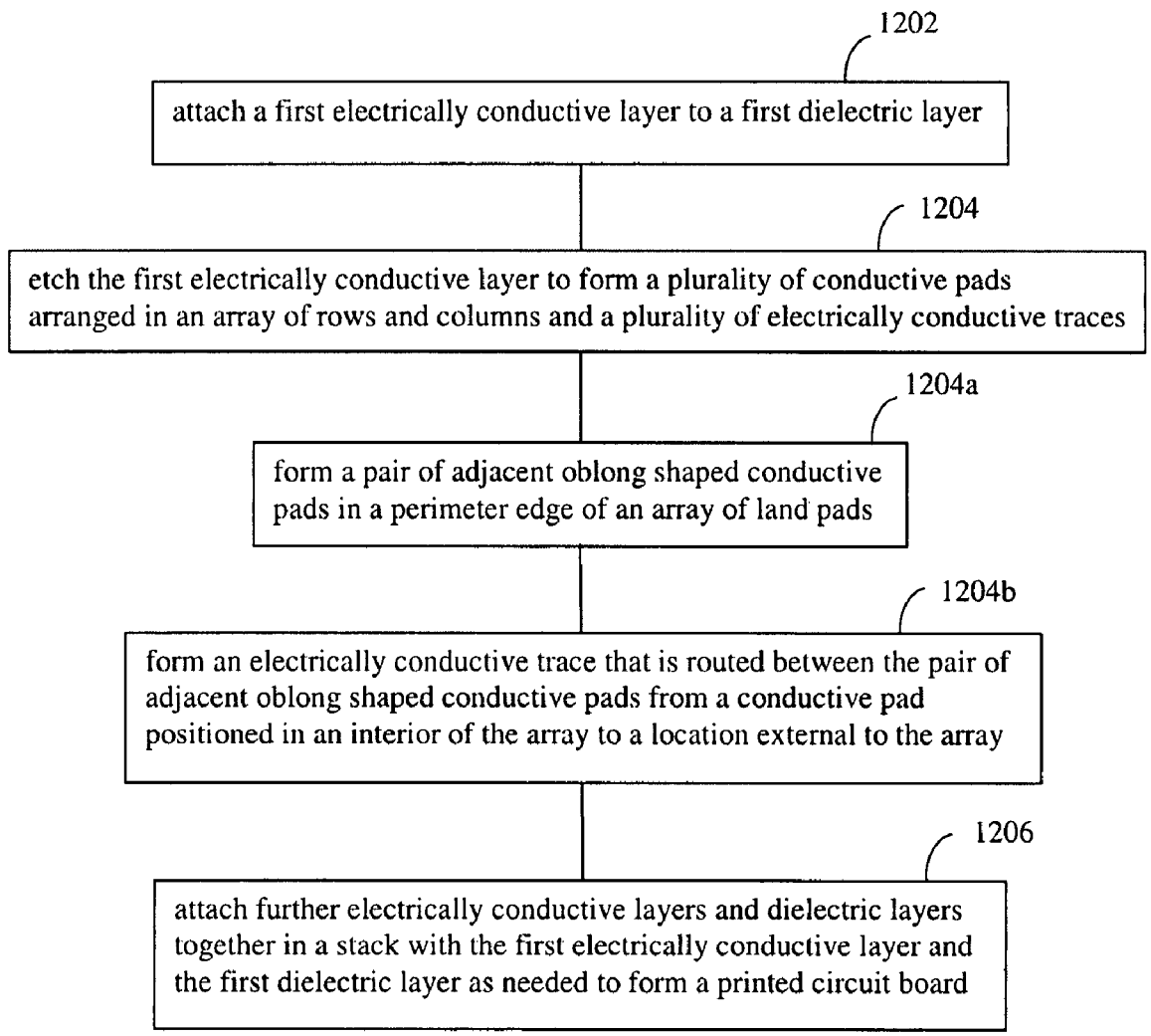
FIG. 12 shows a flowchart providing a process for forming a printed circuit board having a land pattern with oblong shaped land pads and improved routing, according to an embodiment of the present invention.

FIG. 12 shows a flowchart 1200 providing a process for forming a printed circuit board having a land pattern with improved routing, according to an embodiment of the present invention. The steps of flowchart 1200 do not necessarily have to be performed in the order shown. Other structural and operational embodiments will be apparent to persons skilled in the relevant art(s) based on the discussion regarding flowchart 1200. Flowchart 1200 is described as follows.

Flowchart 1200 begins with step 1202. In step 1202, a first electrically conductive layer is attached to a first dielectric layer. For example, as shown in FIG. 8, electrically conductive layer 704 is attached to dielectric layer 706. Electrically conductive layer 704 may be made of any suitable material layer suitable for use in a PCB, such as a metal or combination of metals/alloy. For example, electrically conductive layer 704 (prior to forming pads/routing/etc.) may be a copper foil, or other type of metal foil. Dielectric layer 706 may be any type of dielectric material suitable for use in a PCB, such as a fiberglass material, a plastic, an epoxy, etc. Electrically conductive layer 704 may be attached to dielectric layer 706 in any manner, include by a laminating process using heat and epoxy to bond layers, by an adhesive material, and/or by other attachment mechanism/process.

In step 1204, the first electrically conductive layer is etched to form a plurality of land pads arranged in an array of rows and columns and a plurality of electrically conductive traces. Step 1204 may occur before or after step 1202, in embodiments. An array of electrically conductive land pads and associate routing, such as shown in FIG. 11 for land pattern 1002, may be formed in an electrically conductive layer in any manner, including using conventional techniques or otherwise. For example, an electrically conductive layer may have land pads and routing formed therein by a conventional photoimaging/etching process, or by other suitable process.

In an embodiment, steps 1204a and 1204b may be performed during step 1204. In step 1204a, a pair of adjacent oblong shaped land pads is formed in a perimeter edge of an array of land pads. For example, as shown in FIG. 11, first and second oblong shaped land pads 502a and 502b may be formed in an electrically conductive layer while forming land pattern 1002. As shown in FIG. 11, first and second oblong shaped land pads 502a and 502b are located in perimeter edge 508a of land pattern 1002.

In step 1204b, an electrically conductive trace is formed that is routed between the pair of adjacent oblong shaped land pads from a land pad positioned in an interior of the array to a location external to the array. For example, as shown in FIG. 11, first trace 506a may be formed in the electrically conductive layer while forming land pattern 1002. As shown in FIG.

11, first trace 506*a* is routed between first and second oblong shaped land pads 502*a* and 502*b* from land pad 306*a* located in interior 510 of land pattern 1002.

In step 1206, further electrically conductive layers and dielectric layers are attached together in a stack with the first electrically conductive layer and the first dielectric layer as needed to form a printed circuit board. As described above, any number of electrically conductive layers and dielectric layers may be attached (e.g., laminated, glued, etc.) in a stack to form a PCB, such as PCB 1000 shown in FIG. 10. Embodiments of the present invention enable fewer routing layers and dielectric layers to be attached together in step 1206 as compared to conventional processes, by using oblong shaped land pads 502 to enhance land pattern routing.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A printed circuit board (PCB) configured to mount a ball grid array package, the PCB comprising:
    a dielectric layer; and
    an electrically conductive layer on the dielectric layer;
    wherein the electrically conductive layer includes a plurality of land pads arranged in an array of rows and columns, wherein a perimeter edge of the array includes a pair of adjacent oblong shaped land pads;
    wherein the electrically conductive layer further includes an electrically conductive trace routed between the pair of adjacent oblong shaped land pads from a land pad positioned in an interior of the array to a location external to the array;
    wherein the pair of adjacent oblong shaped land pads includes a first oblong shaped land pad and a second oblong shaped land pad, wherein the first oblong shaped land pad has a length along a first axis that is perpendicular to the perimeter edge and a width along a second axis that is perpendicular to the first axis, wherein the length is greater than the width;
    wherein the interior of the array includes a plurality of substantially round land pads;
    wherein a pair of adjacent substantially round land pads in the interior of the array are separated by a distance, D;
    wherein $D < TW + 2 \times TS$, where
        TW=a width of the electrically conductive trace, and
        TS=a manufacturing tolerance for spacing of the trace from other electrically conductive features of the electrically conductive layer.

2. The PCB of claim 1, wherein the first oblong shaped land pad has opposing first and second ends along the first axis, wherein the first and second ends are rounded.

3. The PCB of claim 1, wherein the first oblong shaped land pad is rectangular shaped.

4. The PCB of claim 1, wherein each of the substantially round land pads has a diameter, DRP;
    wherein $DRP > PP - (TW + 2 \times TS)$, where
        PP=a land pad-to-land pad pitch.

5. The PCB of claim 4, wherein the width, W, of the first oblong shaped land pad is configured such that $W < PP - (TW + 2 \times TS)$.

6. The PCB of claim 1, wherein each of a plurality of perimeter edges of the array includes a plurality of oblong shaped land pads.

7. The PCB of claim 6, wherein the plurality of oblong shaped land pads enables the PCB to have fewer routing layers relative to a second PCB that includes a plurality of land pads arranged in a second array of rows and column, the second array not including oblong shaped land pads in perimeter edges of the second array.

8. The PCB of claim 1, wherein the plurality of land pads is configured to mount a ball grid array package having an array of solder balls.

9. The PCB of claim 1, wherein the electrically conductive trace is configured to route a signal from the land pad positioned in the interior of the array to the location external to the array.

10. The PCB of claim 1, wherein the first oblong shaped land pad has an oval shape, an elliptical shape, an elongated hexagon shape, or an elongated octagon shape.

11. The PCB of claim 1, wherein the array includes a round land pad in a corner of the array.

12. A ball grid array land pattern comprising:
    a plurality of land pads arranged in an array of rows and columns, wherein a perimeter edge of the array includes a pair of adjacent oblong shaped land pads; and
    an electrically conductive trace routed between the pair of adjacent oblong shaped land pads from a land pad positioned in an interior of the array to a location external to the array;
    wherein the pair of adjacent oblong shaped land pads includes a first oblong shaped land pad and a second oblong shaped land pad, wherein the first oblong shaped land pad has a length along a first axis that is perpendicular to the perimeter edge and a width along a second axis that is perpendicular to the first axis, wherein the length is greater than the width;
    wherein the interior of the array includes a plurality of substantially round land pads;
    wherein a pair of adjacent substantially round land pads in the interior of the array are separated by a distance D;
    wherein $D < TW + 2 \times TS$, where
        TW=a width of the electrically conductive trace, and
        TS=a manufacturing tolerance for spacing of the trace from other electrically conductive features of the land pattern.

13. The land pattern of claim 12, wherein the first oblong shaped land pad has opposing first and second ends along the first axis, wherein the first and second ends are rounded.

14. The land pattern of claim 12, wherein the first oblong shaped land pad is rectangular shaped.

15. The land pattern of claim 12, wherein each of the substantially round land pads has a diameter, DRP;
    wherein $DRP > PP - (TW + 2 \times TS)$, where
W=the width of the first oblong shaped land pad, and
PP=a land pad-to-land pad pitch.

16. The land pattern of claim 15, wherein the width, W, of the first oblong shaped land pad is configured such that W<PP−(TW+2×TS).

17. The land pattern of claim 12, wherein each of a plurality of perimeter edges of the array includes a plurality of oblong shaped land pads.

18. The land pattern of claim 12, wherein the plurality of land pads is configured to mount a ball grid array package having an array of solder balls.

19. The land pattern of claim 12, wherein the electrically conductive trace is configured to route a signal from the land pad positioned in the interior of the array to the location external to the array.

20. The land pattern of claim 12, wherein the first oblong shaped land pad has an oval shape, an elliptical shape, an elongated hexagon shape, or an elongated octagon shape.

21. The land pattern of claim 12, wherein the array includes a round land pad in a corner of the array.

* * * * *